United States Patent [19]

Brooks

[11] Patent Number: 4,815,035

[45] Date of Patent: Mar. 21, 1989

[54] SCROLLING LIQUID CRYSTAL SPATIAL LIGHT MODULATOR

[75] Inventor: Robert E. Brooks, Manhattan Beach, Calif.

[73] Assignee: TRW Inc., Redondo Beach, Calif.

[21] Appl. No.: 892,664

[22] Filed: Apr. 8, 1986

[51] Int. Cl.[4] .................... G11C 13/04; G11C 19/30; G02F 1/13; G09G 3/36

[52] U.S. Cl. ........................... 365/108; 365/233; 350/332; 350/335; 340/765; 340/784; 377/67; 377/78

[58] Field of Search ............... 365/108, 183, 238, 233, 365/221, 239, 240; 350/331 R, 332, 333, 335, 350 S; 340/765, 768, 784; 377/67, 78

[56] References Cited

U.S. PATENT DOCUMENTS

| | | | |
|---|---|---|---|
| 3,988,056 | 10/1976 | Hareng et al. | 350/351 |
| 4,040,047 | 8/1977 | Hareng et al. | 365/108 |
| 4,060,801 | 11/1977 | Stein et al. | 350/333 |
| 4,092,734 | 5/1978 | Collins et al. | 365/238 |
| 4,117,472 | 9/1978 | Freer et al. | 350/333 |
| 4,158,786 | 6/1979 | Hirasawa | 350/332 |
| 4,202,010 | 5/1980 | Hareng et al. | 340/784 |
| 4,310,858 | 1/1982 | Hareng et al. | 350/350 S |
| 4,386,351 | 5/1983 | Lowdenslager | 377/67 |
| 4,391,492 | 7/1983 | Lu et al. | 350/351 |
| 4,430,650 | 2/1984 | Billard et al. | 340/784 |
| 4,461,715 | 7/1984 | Lu et al. | 252/299.1 |
| 4,464,020 | 8/1984 | Le Berre et al. | 350/350 S |
| 4,479,118 | 10/1984 | Cole, Jr. | 340/784 |
| 4,481,510 | 11/1984 | Hareng et al. | 340/784 |
| 4,499,458 | 2/1985 | Le Berre et al. | 340/784 |
| 4,536,856 | 8/1985 | Hiroishi | 364/900 |

FOREIGN PATENT DOCUMENTS 0103170 3/1984 European Pat. Off. ............ 365/108

OTHER PUBLICATIONS

Noel A. Clark & Sven T. Lagerwall, "Submicrosecond Bistable Electro Optic Switching in Liquid Crystals," Appl. Phys. Lett., 36(11), pp. 899–901, 1 Jun. 1980.

Primary Examiner—Stuart N. Hecker
Assistant Examiner—Glenn A. Gossage
Attorney, Agent, or Firm—Heal Noel F.; Sol L. Goldstein

[57] ABSTRACT

A device, and a corresponding method for its operation, for converting binary electrical signals into optical form and for scrolling the optical signals across an array of liquid crystal cells. The device in its two-dimensional form includes an array of rows of liquid crystal cells of the ferroelectric smectic type, input circuits for applying binary signals to an input cell in each row, and a three-phase clocking circuit connected to the remaining cells in each row, to propagate the states of the input cells rapidly into successive cells across the array, in the same manner as a shift register, but with the signals being stored in optical form for ease of processing in optical processing apparatus.

21 Claims, 3 Drawing Sheets

PHASE 1

PHASE 2

PHASE 3

PHASE 1

PHASE 2

PHASE 3

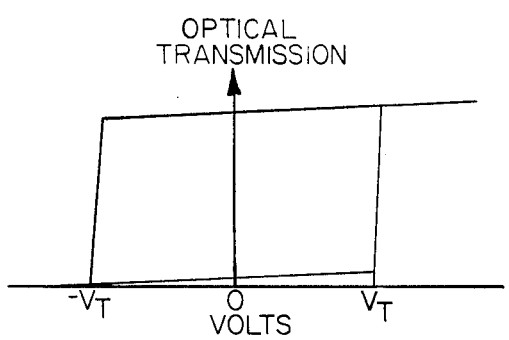
FIG.3
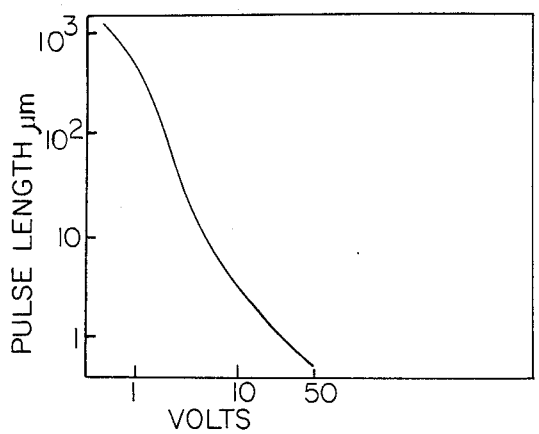
FIG.4
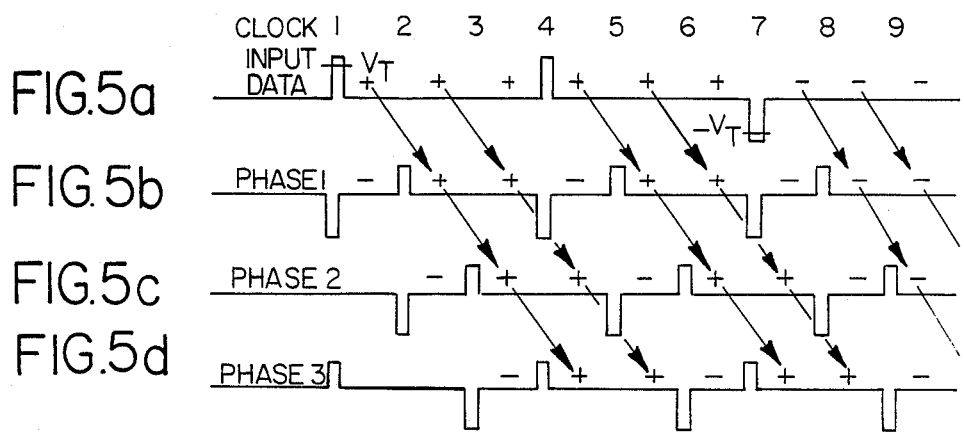
FIG.5a
FIG.5b
FIG.5c
FIG.5d

SCROLLING LIQUID CRYSTAL SPATIAL LIGHT MODULATOR

BACKGROUND OF THE INVENTION

This invention relates generally to electro-optical devices and, more specifically, to electro-optical devices employing liquid crystals for the optical storage of data. Optical data storage is effected by altering the orientation of the liquid crystal molecules within a liquid crystal cell. The orientation affects the polarization of light passing through the cell and therefore provides a technique for reading the data optically. In a number of applications there is a need to convert data from electrical form to an optical form in which the data will be displayed or further processed. One such application is in optical computing systems, in which data elements in optical form are rapidly processed by optical logic elements.

Processing data in optical form is a particularly attractive approach if the data can be automatically scrolled across an optical matrix, since many mathematical manipulations involving matrices can be performed more simply if the data elements remain in matrix form. The conventional electronic processing approach to matrix processing involves retrieving data elements from an electronic memory matrix, and storing intermediate and final results in the same or a different memory matrix. If the matrix data elements are stored in optical form, two optical data matrices can be directly interacted, in optical form, to produce a mathematical result. Moreover, if one matrix can be shifted or scrolled, a matrix multiplication can be performed directly, without converting the data back into electrical form.

Another application for a scrolling optical storage device is the display of data. Conventional liquid crystal displays employ matrix (x-y) addressing methods to enter the data, whereby each liquid crystal element is defined by a unique combination of an x-axis address and a y-axis address, both of which must be selected to access the element. Such displays often employ active devices, such as transistors, in the display structure. When displayed data, which may be textual characters, are scrolled in a conventional liquid crystal display, the data elements have to be rewritten into appropriate locations for each incremental scrolling movement. This requires relatively complex circuitry and is both costly and inconvenient.

Therefore, there is a need in optical computing and related applications for a spatial light modulator that has scrolling capability. The present invention is directed to this end.

SUMMARY OF THE INVENTION

The present invention resides in a scrolling liquid crystal light modulator for propagating data in optical form. Briefly, and in general terms, the scrolling liquid crystal light modulator of the invention comprises an array of liquid crystal cells capable of assuming different optical states in response to electrical signals applied to the cells, and clocking means for applying electrical signals to the cells, to shift the optical states across the array.

More specifically, the array has at least one input liquid crystal cell and the clocking means includes means for applying three clocking signals to all of the liquid crystal cells except the input cell. Each clocking signal is applied to every third liquid crystal cell, to propagate the state of the input liquid crystal cell in a direction away from the input cell. At the input end of the array, an input electrode receives a binary input signal that has either a high voltage state, to input an ON condition to the array, or a low voltage state, to input an OFF condition to the array. The low voltage state may, in fact, be a negative voltage. Adjacent to the input electrode are three clocking electrodes associated with first, second and third liquid crystal cells. The voltage levels applied to these three electrodes are stepped through three-phase cycles in order to propagate the input signals across the array. At the same time that an input signal is propagated into the first group of three cells, the contents of the first group of cells is propagated into the second group of three cells, and so forth.

In one illustrative embodient of the invention, during the first clocking phase a new data bit is introduced at the input electrode, by placing a high voltage level or pulse on the input electrode to indicate an ON condition or a low, or negative, voltage level to indicate an OFF condition.

It should be noted that the ON switching threshold and the OFF switching threshold are not simple voltage thresholds, but also have a time component. For example, switching a cell to the ON condition might be effected by a high voltage level for a short period or by a lower voltage for a longer period. In any event, for simplicity, switching to the ON state is described here as being accomplished with a "high" switching voltage level, and switching to an OFF state is described as being accomplished with a "low" switching voltage level. As already mentioned, the "low" voltage level may be of opposite sign to the high level.

The ON condition can correspond to a binary "1" or a binary "0" depending on the convention chosen. In the first illustrative embodiment of the invention to be described, the input data condition is maintained throughout the first and second clocking phases. During the third clocking phase, a low voltage is applied to the input electrode to reset the input condition to "0" and to isolate successive input data bits.

During the first clocking phase, the first clocking electrode is held in a low condition, and any ON condition at the adjacent input electrode is not propagated beyond the input itself. During this first phase, the second and third clocking electrodes are held in a medium voltage level. The medium level sustains an already present ON state, and will propagate an ON state, if one is present, from an adjacent cell, but will not otherwise initiate an ON state. Therefore, if there was an ON state in the cell corresponding to th first clocking electrode prior to the first clocking phase, this ON state would be propagated to the cell corresponding to the second clocking electrode.

In the second clocking phase, the first clocking electrode is raised to the medium voltage state, the second is lowered to the low state and the third is raised to the medium state. This propagates any ON condition from the input cell to the first cell following the input cell, and simultaneously propagates any ON state in the second cell to the third cell following the input cell.

In the third clocking phase of the illustrative embodiment the first and second clocking electrodes receive a medium voltage pulse and the third clocking electrode receives a low voltage pulse. During this phase, the input cell also receives a low voltage pulse. The effect is to propagate any ON condition from the first cell to the second cell following following the input cell. The input and third cells are switched to the OFF or extinguished state. The overall effect of this clocking procedure is to propagate the input state from cell to cell, in bands that are two cells wide, separated by an extinguished band that is one cell wide.

There are other variations of this clocking scheme within the scope of the invention. For example, in another embodiment data bits are not separated by a low, or negative, pulse applied every third clock cycle. Instead, a logical "zero" is represented at the input by a negative pulse and a logical "one" by a high positive pulse. The input cell is then never turned off except by the input of a "zero" bit. Bit separation is maintained by applying a negative pulse to each successive clocked cell in turn, as the data bits are propagated across the array.

In terms of a novel method, the invention comprises the steps of inputting binary electrical signals into an input liquid crystal cell, selectively switching the input cell between an optical ON state and an optical OFF state in response to the input signals, and applying clocking signals to a succession of liquid crystal cells following the input cell, in such a manner as to propagate the optical state of the input cell across the succession of liquid crystal cells. More specifically, in one embodiment of the invention the step of applying clocking signals includes the steps of applying to the first cell following the input cell a signal of a first level, the effect of which is to propagate the state of the input cell to the first following cell, then applying to the second cell following the input cell a signal of the first level, to propagate the state of the first cell to the second cell following the input cell. The next step is that of applying signals of the first level to both the second and third cells following the input cell, to propagate the input signal from the second cell to the third cell following the input cell, while simultaneously applying a signal of a second level to the first cell following the input cell, to switch the first cell to an OFF condition and to isolate the signal contained in the second and third cells from a new input signal now impressed on the input cell.

Within the scope of the present invention, there are alternatives to the specific clocking scheme described above. As already mentioned, instead of applying a "low" or negative pulse to the input cell during every third phase of operation, to isolate successive data bits, one can apply a low or negative pulse during the first phase whenever the input data is a logical "0". Isolation is still provided by applying a low voltage lvel to the first cell following the input cell during the first clocking phase.

Another variation is to omit any pulsing of the second cell during the first clocking phase. At this point, the cell already has data in it, i.e. it is in the ON state if the data is a logical "1," and no pulsing is needed to sustain the ON state. Further propagation is effected by pulsing in the adjacent third cell. Similarly, one can omit pulsing of the third cell during the second clocking phase. Propagation into the fourth cell occurs as a result of applying a medium pulse to the fourth cell during the third clocking phase. Moreover, it is desirable to avoid two successive medium pulses to the same cell, to minimize the risk that the they may have the same effect as one larger pulse that would switch the cell to the ON state.

More specifically, in another illustrative embodiment of the invention the input cell is switched either ON or OFF in the first clocking phase, depending on the state of the input bit applied to the input cell. During this first phase, the first clocking cell is pulsed low, or negative, to ensure data bit separation with an OFF condition. In the second phase, the input cell has no voltage signal applied to it and the first clocking cell is pulsed with a medium voltage level, to propagate the content of the input cell into the first cell. At the same time, the low or negative condition is applied to the second clocking cell, to maintain separation. In the third clocking phase, the input cell remains at zero voltage level, the first clocking cell is also switched to a zero voltage level, thereby sustaining its previous condition, and the second clocking cell is pulsed with a medium voltage, allowing the content of the first clocking cell to propagate into the second. In the next phase, which is another "first" phase, the second clocking cell has a zero voltage applied to it and the third has a medium voltage pulse, thereby propagating the content of the second cell to the third. The first clocking cell is pulsed with a low or negative signal again, for data separation, and the input cell is pulsed with either a positive or a negative data phase to input the next data bit.

In a preferred form of the invention, the array of liquid crystal cells is two-dimensional and there ar multiple input electrodes, to which multiple input signals are simulaneously applied.

It will be appreciated from the foregoing that the present invention represents a significant advance in the field of optical data processing. In particular, the invention provides a technique for modulating an optical device with a two-dimensional matrix of data, and rapidly scrolling the data in optical form across an array. Other aspects and advantages of the invention will become apparent from the following more detailed description, taken in conjunction with the accompanying drawings.

BRIEF DESCRIPTION OF THE DRAWINGS

FIG. 3 is graph showing the variation of optical transmission characteristics with voltage in a typical bistable liquid crystal cell;

FIG. 4 is a graph showing the voltage-time relationship for switching a liquid crystal cell; and FIGS. 5a-5d are data and clocking signal waveforms for an alternative clocking scheme in accordance with the invention.

DESCRIPTION OF THE PREFERRED EMBODIMENT

Figure 1:
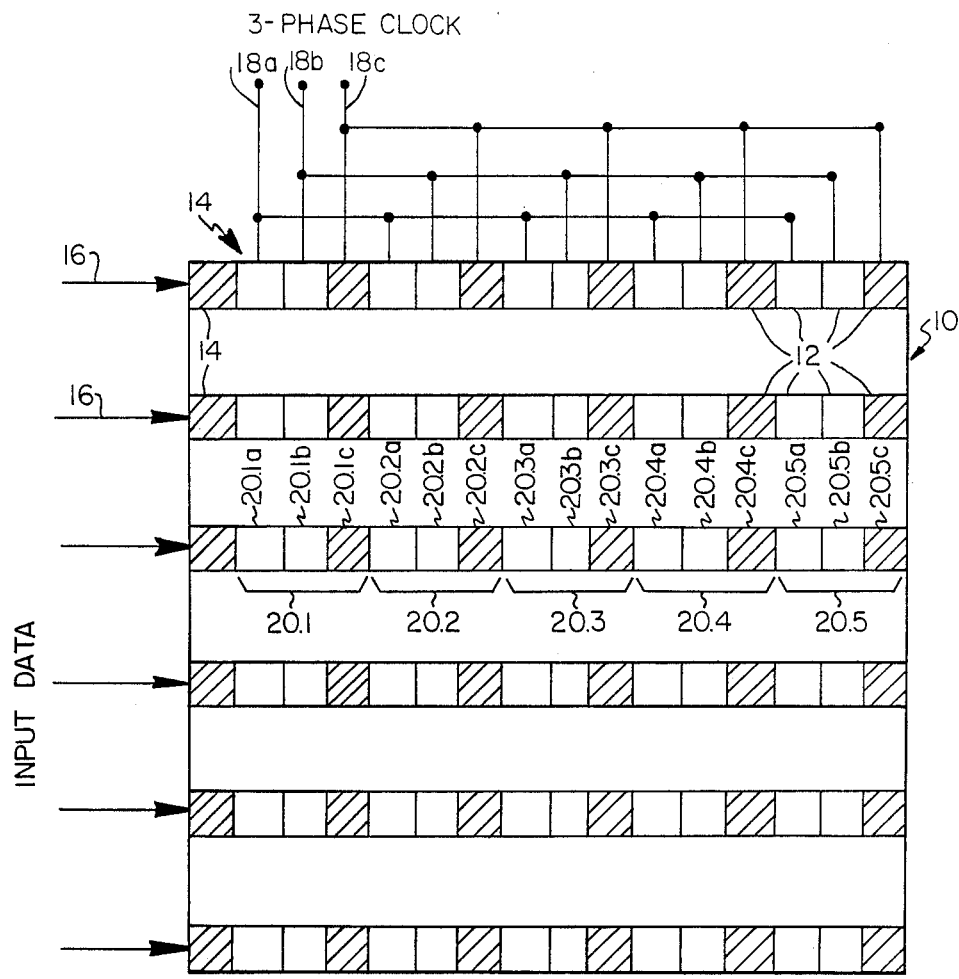
FIG. 1 is a diagrammatic view of a two-dimensional spatial light modulator in accordance with the invention.

As shown in the drawings for purposes of illustration, the present invention is concerned with devices for scrolling of data in optical form, for use in optical computing and related applications. Prior to this invention, there has not been any convenient technique for rapidly scrolling of data in optical form.

In accordance with the invention, binary signals in electrical form are used to control a liquid crystal modulator array, and the binary signals, encoded as different orientations of liquid crystal molecules, are scrolled across the device by means of clocking signals applied to cells of the array. As shown in FIG. 1, the device of the invention in its preferred form is a two-dimensional array of liquid crystal cells. The array is indicated by reference numeral 10 and the individual cells by reference numeral 12. The array 10 has an input end 14 into which binary data signals in binary form are input, as indicated at 16. A data signal input at one row of the array 10 is propagated sequentially across the row of the array to the opposite side. The liquid crystal cells 12 are controlled by clocking signals on three clocking signals lines 18a, 18b and 18c, which are applied to clocking electrodes in each of the cells.

The input signals are used to modulate the state of an input liquid crystal cell, in an input zone or region indicated at 19. FIG. 1 shows five additional data positions in each row of the array 10, indicated at 20.1, 20.2, 20.3, 20.4 and 20.5. Each position in the array has three associated cells, indicated at 20.1a, 20.1b, 20.1c, and so forth to 20.5c. Clocking signals are applied to these cells over clock signal lines 18a, 18b and 18c. That is to say, line 18a is connected to electrodes located adjacent to all of the cells designated with an "a" suffix, line 18b is connected to electrodes adjacent to all of the "b" cells and line 18c is connected to electrodes located adjacent to all of the "c" cells.

By applying an appropriate sequence of clocking signals to the lines 18a, 18b, and 18c, as will be discussed more fully with reference to FIG. 2, data stored in the input cells of the device can be transferred to the first position 20.1, and data in the first position can be transferred to the second position 20.2, and so forth, the whole device functioning very much like a shift register, but with the data stored as different orientations of the liquid crystal molecules, so that it may be read optically.

FIG. 3 shows a typical relationship between the voltage applied to a bistable liquid crystal cell and the resulting optical transmission characteristics. As the voltage is first applied and increased positively, the optical transmission increases only slightly from zero. When a threshold voltage $+V_T$ is reached, the optical transmission of the cell jumps to a much higher value and remains there even when the voltage is subsequently reduced to zero or below. The optical transmission of the cell is not significantly reduced again until the voltage is reduced to a negative threshold level $-V_T$, at which point the optical transmission falls to zero and remains there until the voltage is raised to $+V_T$ again. In the context of this hysteresis curve, a "high" voltage pulse is one above $V_T$ and a "low" voltage pulse is one of a higher negative value than $-V_T$. A "medium" pulse is a positive pulse lower than $+V_T$.

FIG. 3 is not a completely accurate depiction of the behavior of a bistable liquid crystal cell, because the voltage required to effect a transition in optical properties depends on the duration as well as the magnitude of the applied pulse. As shown in FIG. 4, a cell can be switched optically with a one-volt pulse lasting 1,000 microseconds or so, but the same cell can also be switched with a ten-volt pulse lasting only several microseconds.

An important aspect in the construction of the array of the invention is the selection of a suitable liquid crystal cell that permit propagation of its ON state from one cell to an adjacent cell. One type of cell that meets these requirements is the ferroelectric smectic C (FSC) liquid crystal cell, of the type described in a paper entitled "Submicrosecond Bistable Electro-optic Switching in Liquid Crystals," by Noel A. Clark and Sven T. Lagerwall, published in Applied Physics Letters, 36(11), pp. 899-901, 1 June, 1980.

The devices described in the paper meet the principal requirements for the scrolling array application of the invention, such as microsecond switching speed, bistability, domain wall propagation, and appropriate threshold behavior. The threshold behavior of the device determines the conditions by which the ON state of a device cell can be propagated to an adjacent cell. Basically, the invention requires that, when a cell is in the ON state and an adjacent cell is pulsed to an intermediate voltage level, the ON state will propagate to the adjacent cell. The FSC cells have the necessary domain wall propagation properties for this action to occur.

A necessary property of the selected liquid crystal cell is that there be associated with it three bias levels having three distinct functions. A high bias level will initiate switched to the ON state of the device. A low bias level will immediately extinghish the ON state. And finally, an intermediate bias state will result in an ON state only if the immediately preceding adjacent cell is in the ON state. The intermediate bias level permits propagation of data from one cell to the next across the array.

FIG. 2 shows in more detail how the array 10 is clocked to achieve scrolling of data entering the array at the input lines 16. FIG. 2a shows the conditions during the first phase of the clocking cycle, with a data bit bit applied to input line 16 in the form of a high bias voltage, causing an ON condition in the input cell. The first clocking signal, on line 18a is in a low condition during this phase. The other signals on lines 18b and 18c are in the medium condition, but have no effect in this first clocking cycle. The low condition on line 18a ensures that the data ON bit stored in the input zone remains only in that zone for the first phase.

Figure 2A:
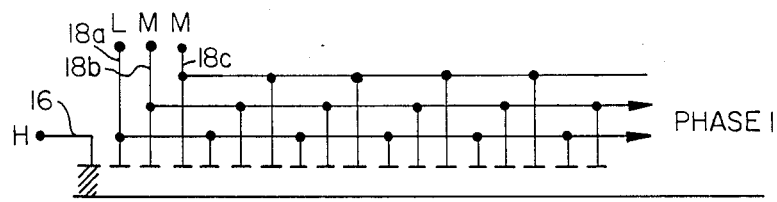
FIGS. 2a-2f together illustrate how the array of the invention is controlled by three-phase clocking signals.
Figure 2B:
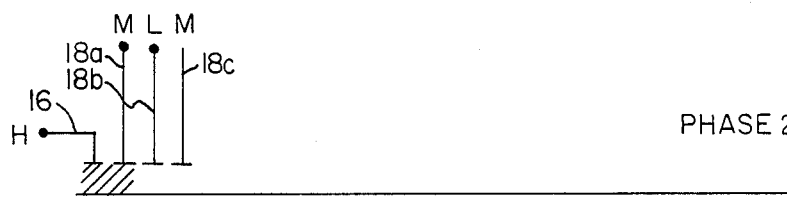

In the second phase of the clocking cycle, shown in FIG. 2b, the levels on lines 18a, 18b, and 18c are switched to medium, low and medium, respectively, and the input line remains high. The medium level on line 18a results in the propagation of the ON condition from the input cell to the first cell, located beneath the first clocking electrode associated with line 18a. The low condition on line 18b ensures that the previous state of the cell beneath the first clocking electrode is not transferred any further.

Figure 2C:
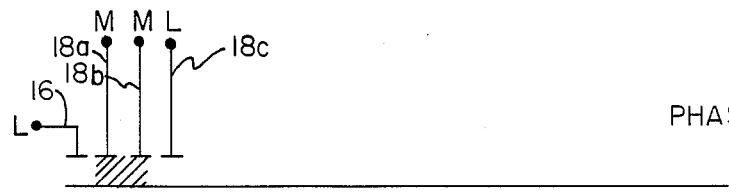

In the third phase of the clocking cycle, shown in FIG. 2c, the clocking signals on lines 18a, 18b and 18c are switched to medium, medium, and low, respectively, and the input line is pulsed to a low condition to turn it off and isolate successive bits of input data. This set of conditions results in the propagation of data from the input cell to the first following cell, and from the first following cell to the second. The low signal applied to the third cell ensures an OFF condition in that cell for the third phase of the cycle.

Figure 2D:
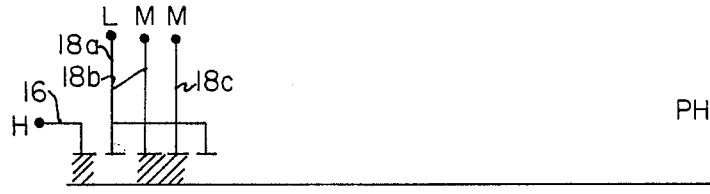
Figure 2E:
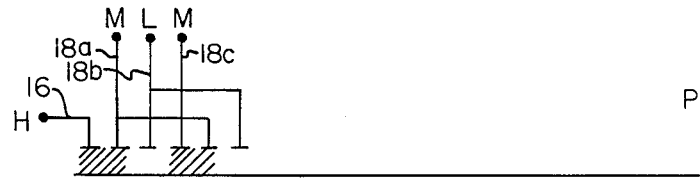
Figure 2F:
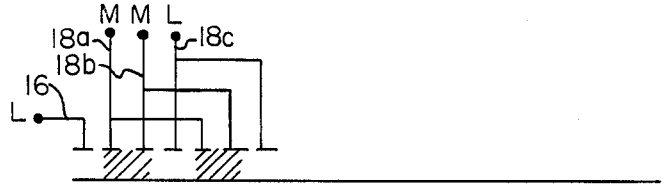

FIGS. 2d-f show the sequence of events during the next clocking cycle, during which another ON bit is input to the array. During the first phase of this cycle, shown in FIG. 2d, the clocking signals take the form: low, medium, medium. This results in the first input bit being transferred to the second and third following cells, while the next data bit is stored in the input cell, separated from the first data bit by the OFF condition associated with the first cell. In the second and third phases of the cycle, shown in FIGS. 2e and 2f, the first data bit has been propagated all the way into the second data position of the array, and the second data bit is stored in the first data position of the array.

It will be observed from FIGS. 2a–2f that the nature of the propagation of data through the array is such that each data bit occupies a band of two adjacent cells in the array, and that data bits in the array are separated by a single cell in the OFF condition. The nature of the clocking cycle is that a low condition is cycled from the first to the second, and then to the third of the clocking signal lines, and it this low condition that isolates adjacent data bits being shifted across the array. Propagation in the reverse direction is prevented by the presence of the isolation cell, the low-biased cell that effectively "follows" the potentially ON region across the array. Propagation takes place because the clocking arrangement can be thought of as continually placing medium-biased cells in front of the potentially ON region, thereby moving it across the array.

An alternative fo the clocking scheme described above is illustrated in FIGS. 5a–5d. FIG. 5a shows a typical input data waveform, and FIGS. 5b–5d are waveforms of the first, second and third clocking signals. The data signal is applied to the data input line 16 (FIG. 1) and the first, second and third clocking signals are applied to the clock signal lines 18a, 18b and 18c, respectively. The liquid crystal array for this embodiment of the invention is identical with the array shown in FIG. 1, but the waveforms of the clocking signals and the data signal are different.

As shown in FIG. 5a, the input data signal takes the form of a non-zero pulse every third clock cycle. Each pulse is either positive or negative, representing a binary "one" and a binary "zero" respectively, and each pulse exceeds the switching threshold of the data cell at the input of the array. In the figure, a positive pulse is shown, by way of example, as occurring at the first and fourth clock cycles, and a negative pulse is shown as occurring at the seventh cycle.

The waveform of the phase-on clock signal (FIG. 5b) includes a negative pulse in excess of the switching threshold in the first cycle, to provide data isolation, followed by a medium (positive) pulse in the second cycle and a "zero pulse" in the third cycle, this sequence then repeating itself every three cycles. The phase-two clock signal follows the same pattern as the phase-one signal, except that the negative pulse occurs in the second cycle and every third cycle thereafter. Likewise, the phase-three clock signal follows a similar sequence but the negative pulse occurs in the third cycle and every third cycle thereafter.

In operation, during the first cycle the input data cell is switched to an ON condition by the presence of a positive pulse exceeding the switching threshold, and the first clocking cell is kept OFF by the presence of a negative pulse. During the second cycle, the input data cell remains ON, even though the voltage is reduced to zero, and the ON condition is propagated into the first clocking cell by the presence of a medium pulse at that cell. Thus, both the data cell and the first clocking cell are in the ON condition. Further propagation is prevented by the negative pulse applied to the second clocking cell.

In the third cycle, the voltage applied to the first clocking cell is reduced to zero, but it remains ON, and a medium pulse applied to the second clocking cell propagates the ON condition from the first clocking cell to the second clocking cell. Further propagation is prevented by the negative pulse now applied to the third clocking cell. At this point, the data cell and the first and second clocking cells are all in the ON condition.

The fourth cycle is equivalent to the first. A new data input is applied to the input data cell and a negative pulse is applied to the first clocking cell, turning it OFF, and to the fourth clocking cell, making sure that the fourth clocking cell is ready to receive data from the third clocking cell. In the next cycle, data is transferred from the input data cell to the first clocking cell and from the third to the fourth of the clocking cells.

This clocking scheme differs from the one first described in two respects. First, the input data cell is never routinely switched OFF after each input. Instead, it is switched ON or OFF in the first and every third clock cycle, to represent data of one or the other binary state. During the second and third clock cycles, no signal is applied to the input data cell and it remains in the condition to which it was switched in the first clock cycle. The other difference is that, instead of applying two medium pulses to adjacent cells to effect propagation across the array, one medium pulse and one "zero pulse" are employed. This improves the reliability of the array, since two consecutive medium pulses applied to a cell could have the same effect as a single pulse in excess of the switching threshold, thereby switching the cell ON inadvertently.

The specific nature of the cell structure employed to effect rapid propagation of data across the array will depend in part on the selection of materials and parameters for the liquid crystal cell. Each cell of the array must retain a separate identity, and yet there must be ease of propagation from cell to cell in one direction. This continuity from cell to cell can be achieved by any convenient means, such as by slightly overlapping adjacent clocking electrodes.

It will be appreciated from the foregoing that the present invention represents a significant advance in the field of signal processing in optical form. In particular, the invention permits arrays of data to be converted to optical form and scrolled rapidly across an optical matrix, in which it may be interacted with other optical data in a highly efficient manner. It will also be appreciated that, although specific embodiments of the invention have been described in detail for purposes of illustration, various modifications may be made without departing from the spirit and scope of the invention. Accordingly, the invention is not to be limited except as by the appended claims.

I claim:

1. A scrolling liquid crystal light modulator, comprising:
    an array of liquid crystal cells capable of assuming different optical states in response to electrical signals applied to the cells, at least one of which is an input liquid crystal cell, the state of which is controlled by input signals applied to the cell from outside the array; and
    clocking means for applying electrical clocking signals to the array cells, to shift the optical states from cell to cell across and within the array, without further application of input data signals except to the input liquid crystal cell or cells.

2. A scrolling liquid crystal light modulator as defined in claim 1, wherein:
    the array of liquid crystal cells is two-dimensional.

3. A scrolling liquid crystal light modulator as defined in claim 1, wherein:

the clocking means includes means for applying a selected one of three clocking signals to each of the liquid crystal cells but not to any input cell, each of the three clocking signals being applied to every third cell, to propagate the state of the input liquid crystal cell from cell to cell across the array in a direction away from the input liquid crystal cell.

4. A scrolling liquid crystal light modulator, comprising:

an array of liquid crystal cells capable of recording binary data as different optical properties of the cells, the array having an input end;

electrical data input means coupled to the input end of the array to receive input signals; and clocking means applied to the array cells to shift binary data across the array in a form represented by different optical properties, which are shifted from cell to cell within the array, without the application of externally provided data signals except those applied to the input end of the array through the electrical data input means.

5. A scrolling liquid crystal light modulator as defined in claim 4, wherein:

the liquid crystal cells are ferroelectric smectic C (FSC) liquid crystals.

6. A scrolling liquid crystal light modulator as defined in claim 4, wherein:

the array of liquid crystal cells is two-dimensional.

7. A scrolling liquid crystal light modulator as defined in claim 6 wherein:

the liquid crystal cells are ferroelectric smectic C (FSC) liquid crystals.

8. A scrolling liquid crystal light modulator as defined in claim 4, wherein:

the array has at least one input liquid crystal cell, the state of which is determined by the input signals, which are applied to the input liquid crystal cell;

the clocking means includes means for applying a selected one of three clocking signals to each of the liquid crystal cells but not to any input cell, each of the three clocking signals being applied to every third cell, to propagate the state of the input liquid crystal cell from cell to cell across the array in a direction away from the input end.

9. A scrolling liquid crystal light modulator as defined in claim 8, wherein:

the liquid crystal cells are ferroelectric smectic C (FSC) liquid crystals.

10. A scrolling liquid crystal light modulator as defined in claim 8, wherein:

each clocking signal has a cycle including three phases;

the input signals are applied to the input cell or cells during two of the three phases of the clocking signals, the input signals being separated by a buffer signal applied to turn the input cell to an off state during every third clocking phase;

each of the clocking signals is in a first condition for one of the three clock phases, to isolate adjacent signals being propagated, and is in a second condition for the other two of the three clock phases, the second condition resulting in propagation of an ON state from an adjacent cell to the one to which the second condition of the clock signal is applied; and the three clocking signals are staggered in their times of occurrence of the first clocking signal condition such that the first clocking signal condition is applied to a set of cells comprising every third cell, and the set is advanced cell by cell across the array in synchronism with the clocking signals.

11. A scrolling liquid crystal light modulator as defined in claim 10, wherein:

the liquid crystal cells are ferroelectric smectic C (FSC) liquid crystals.

12. A scrolling liquid crystal light modulator as defined in claim 8, wherein:

the array of liquid crystal cells is two-dimensional;

there are a plurality of input liquid crystal cells and an equal plurality of rows of clocked liquid crystal cells, each row having a plurality of column positions at which cells are located; and identical clocking signals are applied to liquid crystal cells having the same column position.

13. A scrolling liquid crystal light modulator as defined in claim 12, wherein:

the liquid crystal cells are ferroelectric smectic C (FSC) liquid crystals.

14. A scrolling liquid crystal light modulator as defined in claim 8, wherein:

each clocking signal has a cycle including three phases;

the input signals are applied to the input cell or cells during one of the three phases of the clocking signals, the input signals having a first condition to switch an input cell to an ON state and a second condition to switch an input cell to an OFF state;

each of the clocking signals is in the second condition for one of the three clock phases, to isolate adjacent signals being propagated, is in a third condition during another of the three clock phases, to initiate propagation of an ON state from an adjacent cell, and is in a fourth condition during the third of the clock phases, to preserve the state of a cell from a prior clock phase; and the three clocking signals are staggered in their times of occurrence of the second clocking signal condition such that the second signal condition is applied to a set of cells comprising every third cell, and the set is advanced cell by cell across the array in synchronism with the clocking signals.

15. A scrolling liquid crystal light modulator as defined in claim 14, wherein:

the liquid crystal cells are ferroelectric smectic C (FSC) liquid crystals.

16. A scrolling liquid crystal light modulator as defined in claim 14, wherein:

the array of liquid crystal cells is two-dimensional;

there are a plurality of input liquid crystal cells and an equal plurality of rows of clocked liquid crystal cells, each row having a plurality of column positions at which cells are located; and identical clocking signals are applied to liquid crystal cells having the same column position.

17. A scrolling liquid crystal light modulator as defined in claim 16, wherein:

the liquid crystal cells are ferroelectric smectic C (FSC) liquid crystals.

18. A scrolling liquid crystal light modulator, comprising:

a two-dimensional array of liquid crystal cells, including a plurality of rows of cells, each row having an input cell at its first column position;

electrical means for applying binary input signals to the input cells in a synchronous manner, whereby the input cells are selectively switched to an ON condition dependent upon the states of the corresponding input signals;

means for applying a first clocking signal to the cells in the second column position and to every third following cell in each row;

means for applying a second clocking signal to the cells in the third column position and to every third following cell in each row;

means for applying a third clocking signal to the cells in the fourth column position and to every third following cell in each row;

wherein the first, second and third clocking signals have a three-phase cycle, and each input signal is applied to an input cell during at least one of the three phases, and wherein the state of the input cell is transferred by the clocking signals to the first and second cells of the row, and then to the second and third cells of the row, and is thereafter propagated from cell to cell along the row.

19. A scrolling liquid crystal light modulator as defined in claim 18, wherein:

each of the first, second and third clocking signals includes a level of a first type during one of the clock phases and a level of a second type during at least one of the other two clock phases;

the level of the first type is effective to switch any cell to which it is applied to an OFF state, and is employed to separate adjacent binary signals being propagated across the array; and the level of the second type is effective to propagate an ON state from an immediately adjacent cell to the cell to which the clocking signal is applied.

20. A method for scrolling data across an array in optical form, the method comprising the steps of:

inputting binary electrical signals into an input liquid crystal cell;

selectively switching the input cell to an optical ON state dependent upon the state of the corresponding input signals; and applying clocking signals to a succession of liquid crystal cells following the input cell, in such a manner as to propagate the optical state of the input cell across the succession of liquid crystal cells, without the input of electrical data signals to the array other than those applied through the input liquid crystal cell.

21. A method as defined in claim 20, wherein the step of applying clocking signals includes:

applying to the first cell following the input cell a signal of a first level, the effect of which is to propagate the state of the input cell to the first following cell;

applying to the second cell following the input cell a signal of the first level, to propagate the state of the input cell from the first cell to the second cell following the input cell; and applying a signal of the first level to the third cell following the input cell, to propagate the input signal from the second cell to the third cell following the input cell, while simultaneously applying a signal of a second level to the first cell following the input cell, to isolate the signal propagated to the second and third cells from a new input signal now impressed on the input cell.

* * * * *